(12) United States Patent
Murakami

(10) Patent No.: US 7,417,708 B2
(45) Date of Patent: Aug. 26, 2008

(54) EXTREME ULTRAVIOLET EXPOSURE APPARATUS AND VACUUM CHAMBER

(75) Inventor: Katsuhiko Murakami, Sagamihara (JP)

(73) Assignee: Nikon Corporation, Tokyo (JP)

(*) Notice: Subject to any disclaimer, the term of this patent is extended or adjusted under 35 U.S.C. 154(b) by 40 days.

(21) Appl. No.: 11/111,558

(22) Filed: Apr. 20, 2005

(65) Prior Publication Data

US 2005/0213069 A1 Sep. 29, 2005

Related U.S. Application Data

(63) Continuation-in-part of application No. PCT/JP03/13515, filed on Oct. 23, 2003.

(30) Foreign Application Priority Data

Oct. 25, 2002 (JP) ............................. 2002-311741

(51) Int. Cl.
*G03B 27/42* (2006.01)
*G03B 27/54* (2006.01)
(52) U.S. Cl. .......................................... 355/53; 355/67
(58) Field of Classification Search .................. 355/53, 355/67–69, 59, 30, 52, 55
See application file for complete search history.

(56) References Cited

U.S. PATENT DOCUMENTS 5,192,969 A * 3/1993 Igarashi et al. ................ 355/22
5,303,001 A * 4/1994 Jeong et al. ................... 355/53
6,031,598 A * 2/2000 Tichenor et al. .............. 355/67
6,147,818 A 11/2000 Hale et al.
6,172,825 B1 1/2001 Takahashi
6,359,678 B1 3/2002 Ota
6,683,936 B2 * 1/2004 Jonkers ......................... 378/34
6,859,337 B2 2/2005 Oshino et al.
6,919,951 B2 * 7/2005 Tsuji ............................ 355/67
2001/0038446 A1 * 11/2001 Takahashi ..................... 355/67
2002/0054660 A1 5/2002 Komatsuda et al.
2003/0031017 A1 * 2/2003 Tsuji ........................... 362/268
2003/0098959 A1 * 5/2003 Hagiwara et al. ............. 355/69
2003/0174303 A1 * 9/2003 Naulleau ...................... 355/71

FOREIGN PATENT DOCUMENTS

| EP | 985976 A2 | 3/2000 |
| EP | 1039510 A1 | 9/2000 |
| EP | 1061561 A1 | 12/2000 |
| EP | 1202101 A2 | 5/2002 |

* cited by examiner

*Primary Examiner*—Hung Henry Nguyen
(74) *Attorney, Agent, or Firm*—Frishauf, Holtz, Goodman & Chick, P.C.

(57) ABSTRACT

An extreme ultraviolet exposure apparatus comprising a light source that emits extreme ultraviolet light, a plurality of illumination reflective mirrors that direct the extreme ultraviolet light emitted from the light source to a mask, a plurality of projection reflective mirrors that direct the extreme ultraviolet light reflected by the mask onto a sensitive substrate and that project and focus an image of the mask on this sensitive substrate, and a projection system optical housing that accommodates at least one of the projection reflective mirrors and at least one of the illumination reflective mirrors.

14 Claims, 5 Drawing Sheets

(a)　　　　　　　　　　(b)

US 7,417,708 B2

EXTREME ULTRAVIOLET EXPOSURE APPARATUS AND VACUUM CHAMBER

This is a continuation-in-part from PCT International Application No. PCT/JP2003/013515 filed on Oct. 23, 2003, which is hereby incorporated.

TECHNICAL FIELD

The present invention relates to an extreme ultraviolet (EUV: light with a wavelength of 4.5 nm to 30 nm) exposure apparatus and a vacuum chamber equipped with an exposure apparatus.

BACKGROUND ART

In exposure apparatuses used in the manufacture of semiconductors, a circuit pattern formed on a mask surface that is used as an object plane is projected and transferred onto a substrate such as a wafer via an image focusing optical system. The substrate is coated with a resist, and the resist is made photosensitive by exposure, so that a resist pattern is obtained.

The resolution w of an exposure apparatus is determined mainly by the exposure wavelength $\lambda$ and the numerical aperture NA of the image focusing optical system, and is expressed by the following equation:

$$w = k\lambda/NA \quad k: \text{constant}$$

Accordingly, in order to improve the resolution, it is necessary either to shorten the wavelength or to increase the numerical aperture. Currently, exposure apparatuses used in the manufacture of semiconductors use mainly the i line with a wavelength of 365 nm, so that a resolution of 0.5 μm is obtained at a numerical aperture of approximately 0.5. Since it is difficult from the standpoint of optical design to increase the numerical aperture, it will be necessary to shorten the wavelength of the exposing light in order to further improve the resolution in the future. Excimer lasers may be cited as an example of exposing light with a wavelength shorter than the i line; since the wavelength is 248 nm in the case of a KrF excimer laser and 193 nm in the case of an ArF excimer laser, a resolution of 0.25 μm is obtained in the case of a KrF excimer laser, and a resolution of 0.18 μm is obtained in the case of an ArF excimer laser, in cases where the numerical aperture is set at 0.5. Furthermore, if extreme ultraviolet light (hereafter also referred to as "EUV light") which has an even shorter wavelength is used as exposing light, a resolution of 0.1 μm or finer is obtained (for example) at a wavelength of 13 nm.

A conventional exposure apparatus is constructed mainly from a light source, an illumination optical system and a projection image focusing optical system. The projection image focusing optical system is constructed from a plurality of lenses, reflective mirrors, or the like, and focuses an image of a pattern on the mask on the wafer.

Meanwhile, if an attempt is made to design a projection optical system for EUV in order to obtain a higher resolution, the exposure field becomes smaller, so that the desired area cannot be exposed at one time. Accordingly, a method is employed in which a semiconductor chip with a size of 20 mm square or greater is exposed using a projection optical system with a small exposure field by scanning the mask and wafer during exposure. By doing this, it is possible to expose the desired exposure area even using an extreme ultraviolet projection exposure apparatus. For example, in cases where exposure is performed using EUV light with a wavelength of 13 nm, a high resolution can be obtained by forming the exposure field of the projection optical system in the form of an ring shape.

FIG. 5 shows a schematic diagram of an extreme ultraviolet projection exposure apparatus. 1 indicates a point that generates EUV light. The light source is not shown in the figure; however, various types of extreme ultraviolet (EUV) light sources such as a laser plasma light source and discharge plasma light source can be used. The EUV light that is emitted from the EUV light generating point 1 is collected by a light collector mirror 3, and is directed to a mask 19 by illumination reflective mirrors 4 through 12. It is desirable to use an optical system that forms a secondary light source as the illumination optical system that includes the illumination reflective mirrors 4 through 12; in the present example, fly-eye reflective mirrors 5 and 6 are disposed as such a secondary light source. The EUV light that is reflected by the mask 19 is directed onto the wafer 20 by projection reflective mirrors 13 through 18, and an image of the mask 19 is projected and focused on the wafer 20. Multi-layer optical films (e.g., films in which Mo and Si are alternately laminated) are formed on the respective reflective mirrors 4 through 18 and mask 19 in order to increase the reflectivity of EUV light. The mask 19 is illuminated with extreme ultraviolet light so as to have a ring shape exposure field.

The mask 19 and wafer 20 are moved in synchronization at a rate corresponding to the demagnification ratio (e.g., ¼) of the projection optical system so that the desired area (e.g., an area equivalent to one semiconductor chip) is exposed.

In such an extreme ultraviolet optical system, beginning with the extreme ultraviolet projection optical system, since a transparent glass material is not obtained, the EUV exposure apparatus is constructed entirely from a reflective optical system (normal incidence by means of multi-layer films and grazing incidence by means of total reflection).

Exposure apparatuses using conventional light mainly utilize a refractive optical system. FIG. 4 shows the construction of an exposure apparatus using conventional light. The light emitted from the light source 101 passes through an illumination system 102, and illuminates a mask 103. The light beam that passes through the mask 103 focuses the pattern of the mask 103 on the wafer 105 by a projection system 104. The illumination system 102 and projection system 104 are respectively formed into units, and a mask stage (not shown in the figure) on which the mask 103 is mounted is disposed between these units. In an optical system using a refractive optical system, since the light always advances in the forward direction, the successive disposition of the necessary units in this manner is easy.

On the other hand, in the case of an EUV exposure apparatus such as that shown in FIG. 5, since [the optical system is] a reflective optical system, the respective mirrors must be disposed so that the light beams that are incident on the mirrors and the light beams that are reflected by the mirrors do not overlap. In particular, in the case of the final mirror 12 of the illumination system (i.e., the mirror that is closest to the mask), the angle of incidence of the light rays on the mask 19 must be close to perpendicular; accordingly, this mirror must be disposed in a position that is in close to the projection system.

The respective reflective mirrors are relatively positioned by being mechanically held in a optical housing (optical housing unit). However, in cases where six projection system mirrors 13 through 18 are held in such a optical housing, there is a possibility of mechanical interference between this projection system optical housing and the illumination system mirror 12; accordingly, disposition is difficult, and even in cases where such disposition is possible, the problem of an extremely restricted disposition remains. Furthermore, in cases where a disposition that is devised to avoid mechanical interference is used, there is a problem in that the optical performance must be sacrificed to some extent.

SUMMARY OF THE INVENTION

The present invention was devised in light of the conventional problems described above; the instant disclosure provide an extreme ultraviolet exposure apparatus and a vacuum chamber which allow an optimal disposition of the optical system from the illumination system to the projection system without generating mechanical interference.

In view of the problems of conventional devices as described above, the instant disclosure provides an extreme ultraviolet exposure apparatus and a vacuum chamber.

According to the first aspect of the invention, an extreme ultraviolet exposure apparatus are provided that this apparatus has a light source that emits extreme ultraviolet light, a plurality of illumination reflective mirrors that direct the extreme ultraviolet light emitted from the light source to a mask, a plurality of projection reflective mirrors that direct the extreme ultraviolet light reflected by the mask onto a sensitive substrate and that project and focus an image of the mask on the sensitive substrate, and a projection system optical housing that accommodates at least one of the projection reflective mirrors and at least one of the illumination reflective mirrors.

The freedom of disposition of the illumination reflective mirrors is increased by holding illumination reflective mirrors which might possibly generate mechanical interference with the projection system optical housing inside the projection system optical housing, so that the optical performance of the exposure apparatus can be increased.

Desirably, the illumination reflective mirrors accommodated in the projection system optical housing include the reflective mirror that is closest to the mask on the optical path between the light source and the mask.

The mirror that is closest to the mask tends to generate mechanical interference with the projection system optical housing. Accordingly, the mirror is accommodated inside the projection system optical housing, so that mechanical interference with the projection system optical housing is eliminated.

Desirably, the end surface on the mask side of the illumination reflective mirror that is closest to the mask is formed with a shape that does not block the extreme ultraviolet light that is reflected by the mask.

Since a mirror has thickness, when a reflective mirror is located in close to the projection system, there is a possibility that the light beam reflected from the mask will be blocked. Accordingly, by forming the shape of the illumination reflective mirror that is closest to the mask as a shape that does not block the light beam, the freedom of disposition of the mirrors can be increased.

Desirably, the shape that does not block the extreme ultraviolet light is a wedge shape.

Desirably, the illumination reflective mirror that is closest to the mask is hold in place by a portion other than the end surface through which the light beam reflected from the mask passes.

The term "[portion] other than the end surface through which the light beam reflected from the mask passes" refers to any portions of both side surfaces of the mirror or the end surface on the opposite side from the mask side. For example, the illumination reflective mirror is fastened at three points in these portions. Furthermore, the shape of the mirror is not limited to rectangular; mirrors of various shapes such as round can also be used. If the end surface on the mask side is held, there is a possibility that the holding member will block the light beam. However, if the mirror is held by a portion other than the end surface on the mask side, there is no blocking of the light beam.

Desirably, all of the plurality of projection reflective mirrors are disposed in the projection system optical housing.

By disposing all of the mirrors in a single projection system optical housing, it is possible to treat the entire optical system as a single unit. Accordingly, this projection system optical housing is disposed, for example, in a wave front aberration measuring device, and optimized so that the desired performance [requirements] are satisfied; then, the subsequent disposition of the projection system unit in the exposure apparatus is facilitated. Furthermore, since the projection system as a whole can also be handled as a unit during the assembly of the exposure apparatus, this assembly is facilitated. Moreover, by building the reflective mirror cooling system and positioning system into the projection system unit, it is also possible to measure the performance of the apparatus under the same apparatus conditions as in the case of exposure.

Desirably, the apparatus has a vacuum chamber that accommodates at least the projection system optical housing.

The intensity of extreme ultraviolet light is greatly attenuated in the atmosphere; accordingly, it is desirable that at least the projection system optical housing be disposed in a vacuum chamber. This vacuum chamber may be a vacuum chamber that surrounds the entire exposure apparatus, or a plurality of vacuum chambers may be installed so that the respective types of units that constitute the exposure apparatus are independently disposed in these vacuum chambers, or so that several units are disposed in each vacuum chamber. However, it is desirable to arrange [the system] so that at least the projection system optical housing is surrounded by a vacuum chamber (a plurality of vacuum chambers may also be used).

Desirably, the projection reflective mirrors are disposed in the projection system optical housing so that the positions and attitudes of these mirrors are adjustable.

In order to ensure that the projection system optical housing satisfies the specifications required in the apparatus, it is desirable that the positions and attitudes (angles, rotation, etc.) of the reflective mirrors be made adjustable. Accordingly, it is important that the reflective mirrors be disposed so that the positions and attitudes of these mirrors are adjustable. Furthermore, it is also desirable to dispose actuators in order to adjust these positions and attitudes.

According to the second aspect of the invention, a vacuum chamber comprising an exposure apparatus inside is provided and at least the exhaust rate or leak rate is made variable.

If the exhaust rate or leak rate of the vacuum chamber is too high, there is a possibility that the following problems will arise:

(1) Particle may be kicked upward and adhere to the optical elements and the like (in particular, particle adhering to the mask has a fatal effect).

(2) Local pressure differences may be generated inside the optical housing mechanism; as a result, deformation, positional deviation, or the like of the mirrors may occur, so that the characteristics of the optical system deteriorate.

(3) Local thermal contraction may occur inside the optical housing mechanism as a result of a temperature drop caused by adiabatic expansions; as a result, deformation, positional deviation, or the like of the mirrors may occur, so that the characteristics of the optical system deteriorate.

However, since the exhaust rate and leak rate vary according to the degree of vacuum, if only the maximum rates are optimized, the exhaust time or leak time is lengthened. In the present invention, on the other hand, the exhaust rate and leak rate can be controlled in accordance with the degree of vacuum; accordingly, the exhaust time and leak time can be shortened, so that the throughput of the apparatus can be increased.

DETAILED DESCRIPTION OF PREFERRED EMBODIMENTS

Figure 1:
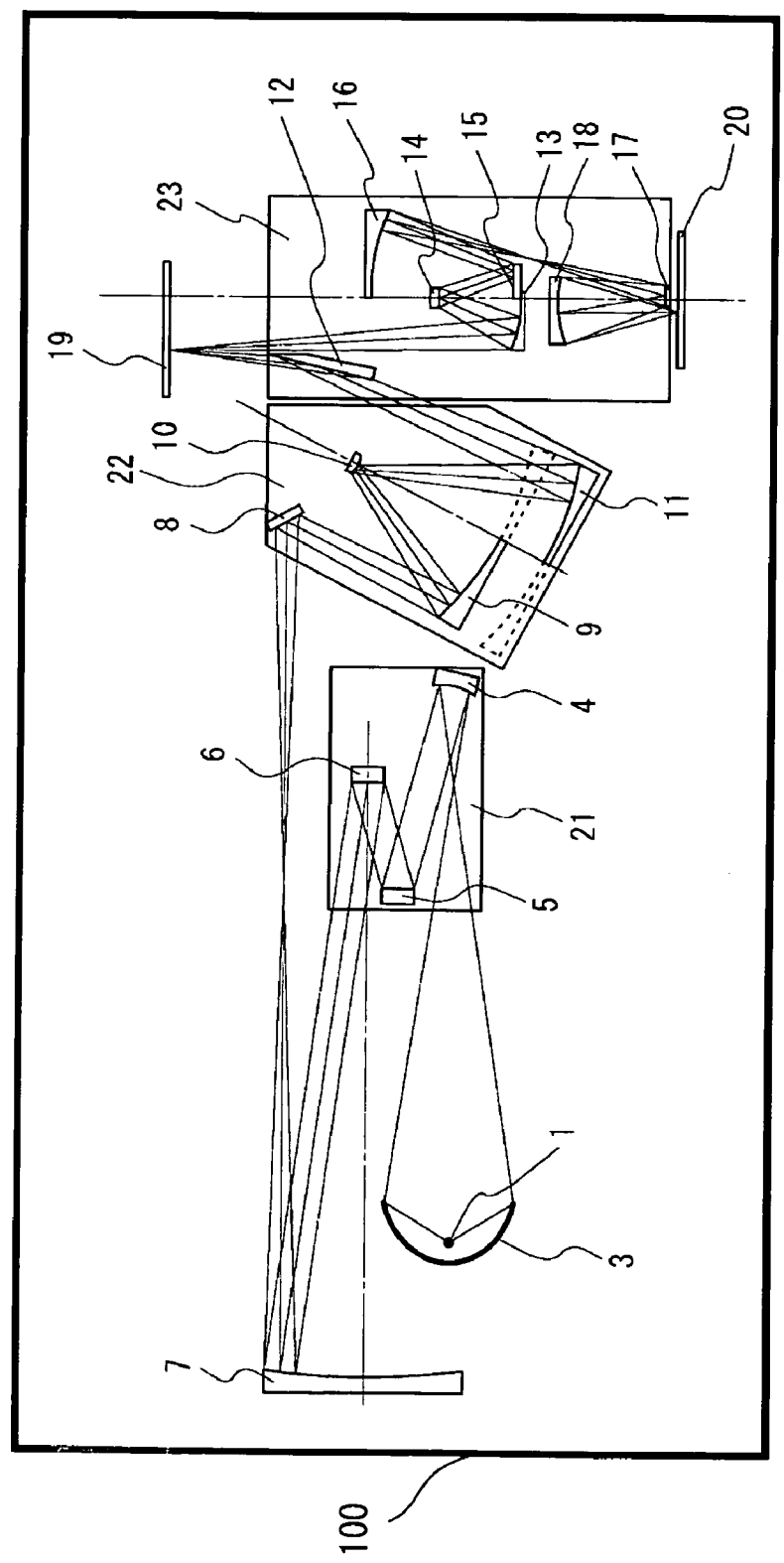
FIG. 1 is a structural diagram of an EUV exposure apparatus constituting a first working configuration of the present invention.

Working configurations of the present invention will be described below with reference to the figures. FIG. 1 is a schematic diagram showing the construction of an extreme ultraviolet (EUV) exposure apparatus constituting a first working configuration of the present invention. The basic construction of the optical system in this construction is the same as that shown in FIG. 5. Accordingly, the same symbols are assigned to constituent elements that are the same as constituent elements in FIG. 5, and a description of the operation and the like of these constituent elements is omitted.

The mirrors 4, 5 and 6 that constitute the illumination system are mechanically held by holding means (not shown in the figure) inside a single illumination system optical housing 21, so that these mirrors are formed into a unit. The illumination system mirror 7 has a structure that is held alone. The illumination system mirrors 8 through 11 are formed into a unit by being mechanically held by holding means (not shown in the figure) inside a single illumination system optical housing unit 22.

The reason that illumination system optical housing units 21 and 22 and an individually held mirror 7 are used instead of forming the illumination system optical housings into a single unit is that the overall optical adjustment can be facilitated by positioning the mirrors for each unit. Furthermore, the relative positional relationship of the illumination system units 21 and 22 and mirror 7 is determined by these parts being held mechanically by an optical system holding frame not shown in the figure. The optical system holding frame is fastened to the main frame of the device, and is attached to the floor via a vibration eliminating device (active vibration isolation system: AVIS).

As a result of such a construction, vibration of the floor and vacuum exhaust system tends not to be transmitted to the optical system holding frame; accordingly, vibration tends not to be transmitted from the outside or from the vacuum exhaust system to the vacuum chambers of the illumination system optical housing units 21 and 22 or the like.

The projection system mirrors 13 through 18 are mechanically held by holding means (not shown in the figure) in the projection system optical housing (unit) 23. Furthermore, the mirror 12 which is a part of the illumination system is also mechanically held in the optical housing unit 23. Thus, since a construction is used in which the illumination system mirror 12 is held together with the projection system mirrors 13 through 18 inside the projection system optical housing unit 23, the illumination system mirror 12 does not cause mechanical interference with the optical housing unit 23. Accordingly, the degree of freedom in the disposition and shape of the illumination system mirror 12 is increased.

Figure 5:
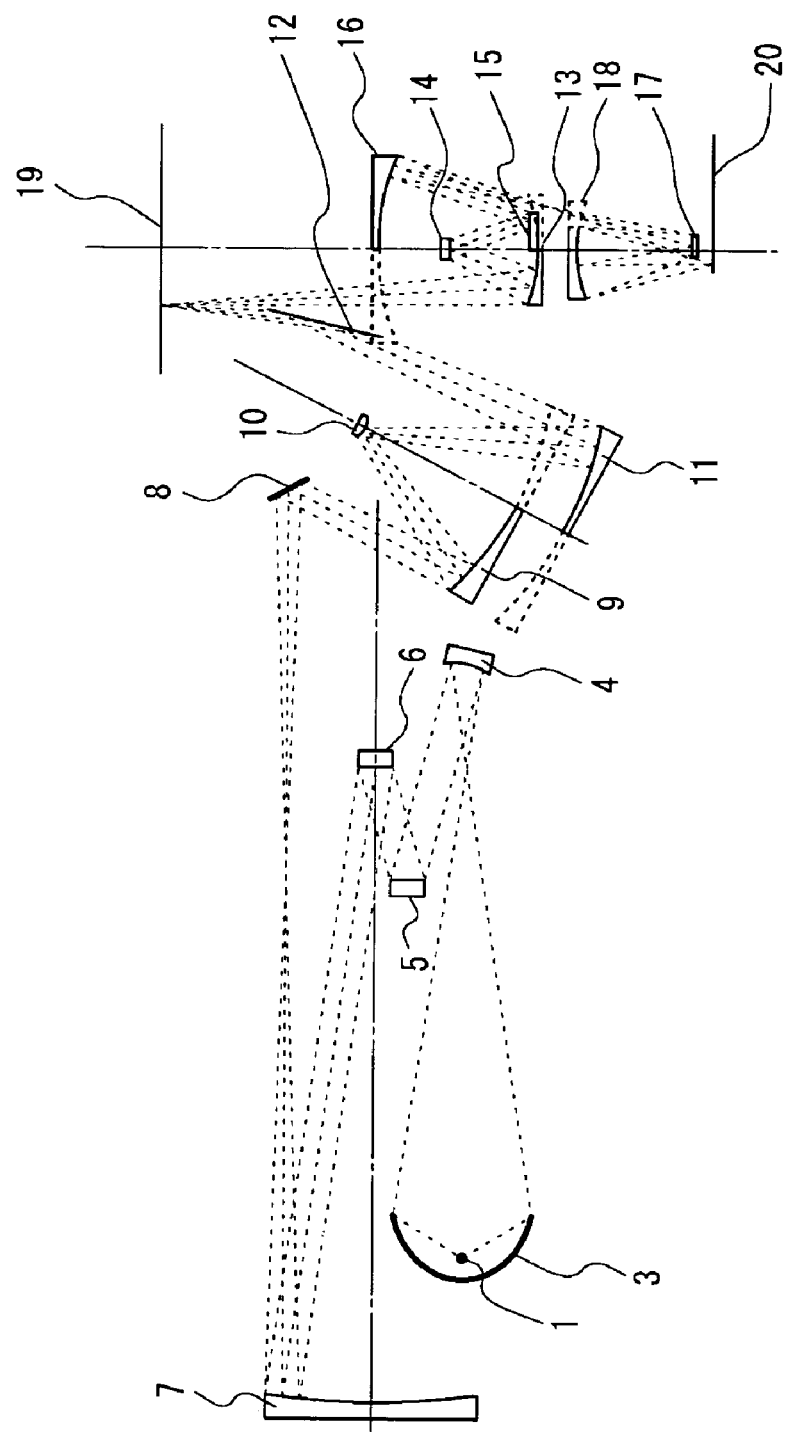
FIG. 5 is a layout diagram of the optical system of an EUV exposure apparatus.

In particular, in cases where the thickness of the projection system optical housing unit 23 must be increased for reasons of strength or the like, there is a possibility in the conventional example shown in FIG. 5 that it will become impossible to install the projection system mirror 12 unless measures such as the formation of cut-outs in the optical housing or the like are adopted. However, this is undesirable for reasons such as the following: namely, the formation of cut-outs in the optical housing, which ordinarily has a cylindrical shape, causes the strength to drop and the optical characteristics to become unstable. In the present construction, on the other hand, since the mirror 12 is installed inside the optical housing unit 23, such problems do not arise.

In the device shown in FIG. 1, the projection optical system, illumination optical system, mask and wafer are all disposed inside a single vacuum chamber 100; however, it would also be possible to install respectively independent vacuum chambers for each of these parts, i.e., projection optical system, illumination optical system, mask, wafer, and the like. Furthermore, various types of layouts that have been used in the past may be adopted; however, it is desirable that at least the projection system optical housing unit be disposed inside a vacuum (reduced-pressure) chamber, so that attenuation of the EUV light is prevented.

Furthermore, with regard to the positions and adjustments of the respective mirrors, the methods disclosed in U.S. Pat. No. 6,147,818 and an undisclosed U.S. patent application (application Ser. No. 10/603,732), for example, can be incorporated into a working configuration of the present invention either "as is" or after being appropriately modified.

With regard to the cooling method, various types of methods that have been used in the past, such as methods utilizing radiation from the mirror and cooling methods using gases or liquids, can be applied.

When the projection system optical housing unit 23 is incorporated into the exposure apparatus, it is necessary to check whether or not this projection system optical housing unit 23 satisfies the desired performance [requirements] prior to this incorporation. For example, the positions and attitudes of the mirrors 13 through 18 are adjusted while performing wave front measurements. At the time of such wave front measurements, since the mirror 12 causes no deleterious effects or inconvenience with respect to the measurements even if this mirror is attached to the projection system optical housing unit 23, assembly adjustments can be performed by the same procedures as those used in the past. Following the completion of these adjustments, the projection system optical housing unit 23 is mounted in the main body of the EUV exposure apparatus together with the illumination system mirror 7, illumination system units 21 and 22, and the like. Then, the positions and attitudes of the respective illumination units are adjusted so that the illuminating light is incident on specified positions of the mask 19 at a specified angle of incidence.

Figure 2:
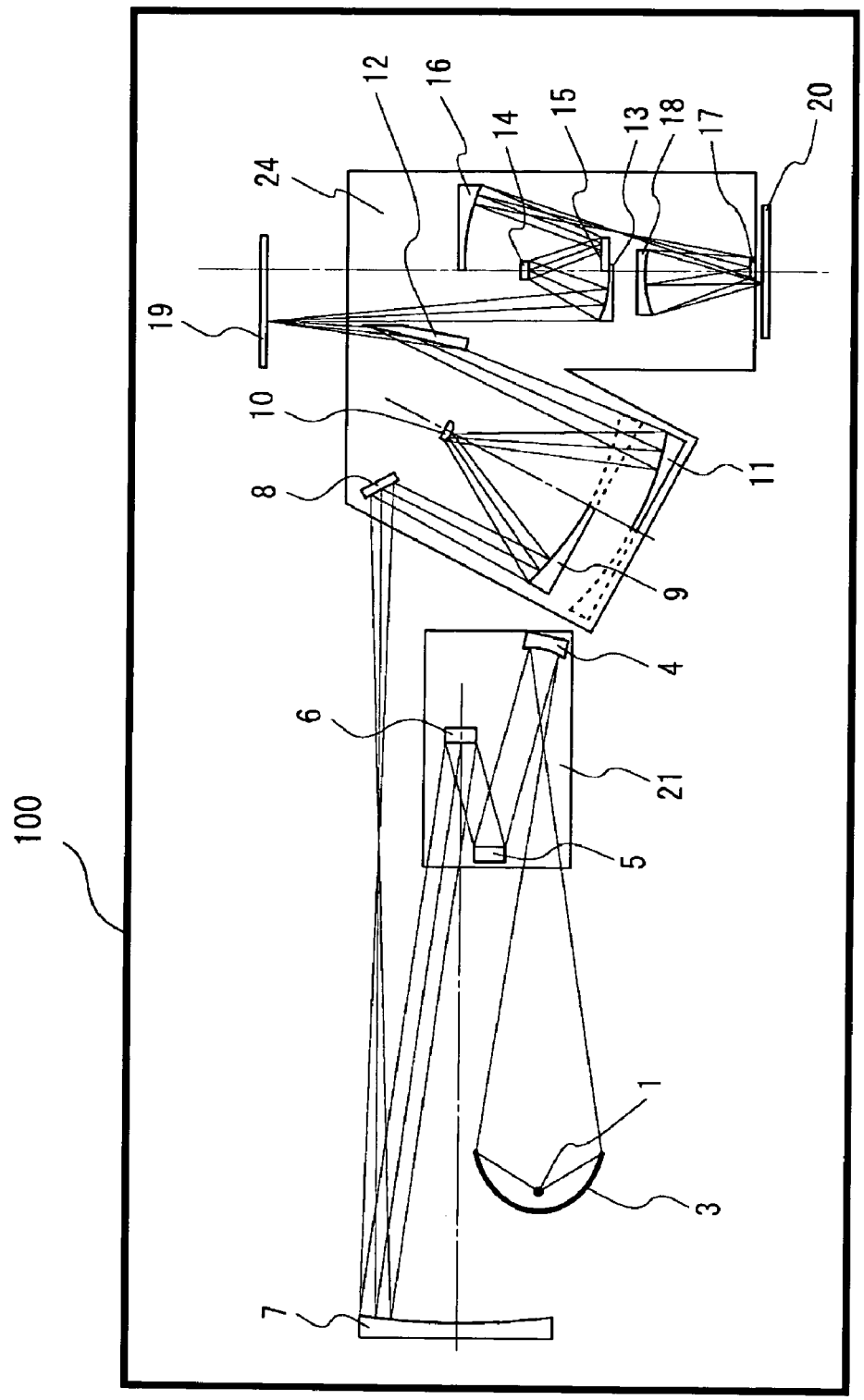
FIG. 2 is a structural diagram of an EUV exposure apparatus constituting a second working configuration of the present invention.

FIG. 2 is a schematic diagram showing the construction of an EUV exposure apparatus constituting a second working configuration of the present invention. In this working configuration as well, the basic construction of the optical system is the same as that of the conventional system shown in FIG. 5. Accordingly, constituent elements that are the same as constituent elements shown in FIG. 5 are labeled with the same symbols, and a description of the operation and the like of these elements is omitted. The difference between the EUV exposure apparatus shown in FIG. 1 and the EUV exposure apparatus shown in FIG. 2 is that the mirrors 8, 9, 10 and 11 held in the illumination system optical housing unit 22 in the apparatus shown in FIG. 1 are held inside the projection system optical housing unit 24 in the apparatus shown in FIG. 2. Since the other constructions are the same as those shown in FIG. 1, a description of these constructions is omitted.

Since it is necessary (as was described above) for the reflective mirror 12 to be installed close to the projection system, the reflective mirror 12 which is a mirror of the illumination system is disposed inside the projection system optical housing unit 23 in the example shown in FIG. 1. However, in cases where the reflective mirror 12 and the mirrors 8, 9, 10 and 11 which are reflective mirrors in the upstream of this reflective mirror 12 are located in close to each other, there is a possibility of mechanical interference between these mirrors and the projection system optical housing.

Accordingly, in such a case, it is desirable that these mirrors 8, 9, 10 and 11 also be disposed inside the projection system optical housing. Furthermore, in the case of the projection optical system, as was described above, it is necessary to measure various optical characteristics such as wave front aberration. The working configuration shown in FIG. 2 can meet such requirements.

Furthermore, in the present working configuration, as in the working configuration shown in FIG. 1, the mirrors 8 through 12 have no effect on wave front measurements or the like that are performed in order to measure the performance of the projection optical system.

On the other hand, if there is an excessive disposition of illumination system mirrors in the projection system unit, it becomes difficult to dispose the projection system unit in the device that measures optical characteristics. Accordingly, it is desirable that the number of illumination system mirrors disposed in the projection system optical housing unit be minimized, so that the projection system unit is reduced in size. From this standpoint, the working configuration shown in FIG. 1 is more desirable.

Figure 3:
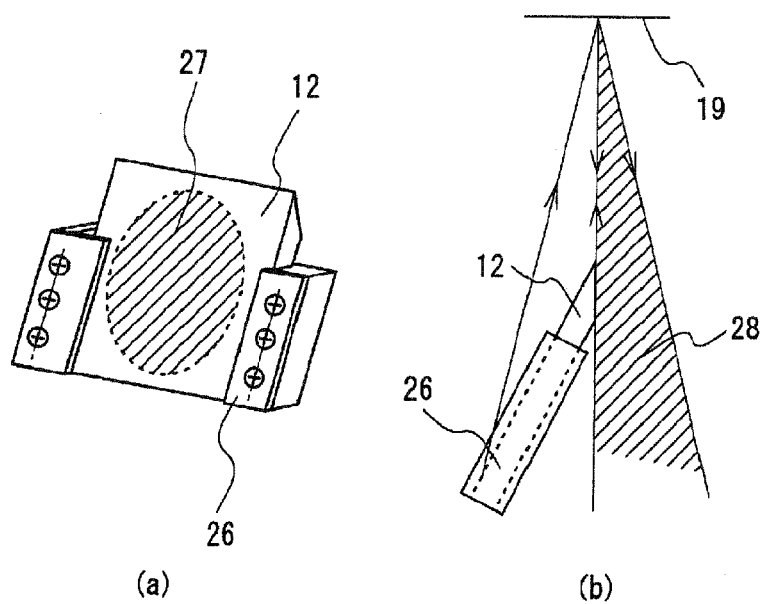
FIG. 3 is a diagram showing details of the illumination system mirror immediately preceding the mask in an EUV exposure apparatus constituting a working configuration of the present invention.
Figure 4:
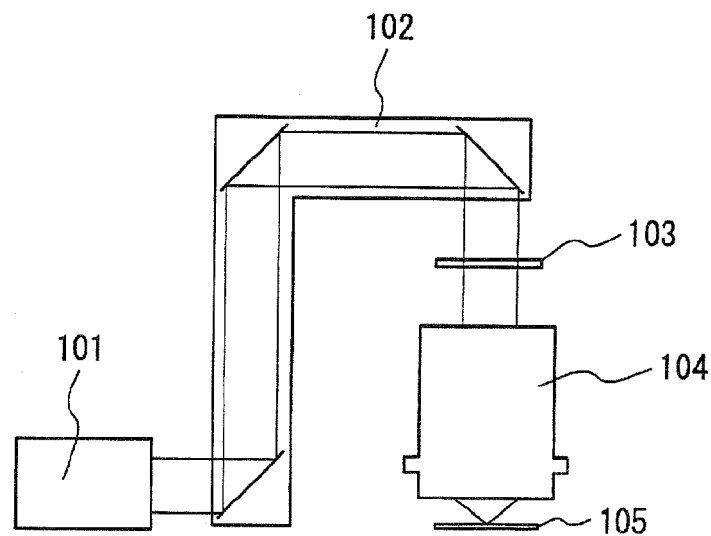
FIG. 4 is a structural diagram of a conventional exposure apparatus.

FIG. 3 shows diagrams that are used to illustrate details of the mirror 12 in the first and second working configurations of the present invention. FIG. 3(a) is a perspective view, and FIG. 3(b) is a diagram showing the relationship with the light beam.

The mirror 12 must be disposed so that this mirror does not block the light beam reflected by the mask 19. Accordingly, the end surface on the side of the mask 19 has a wedge-form cross-sectional shape as shown in the figure.

Furthermore, if the holding mechanism for the mirror 12 holds the end surface on the side of the mask 19, the light beam will be blocked; accordingly, it is necessary that the mirror be held in an area other than the mask-side end surface. In the present working configuration, a construction is used in which both side surfaces of the mirror 12 are held by a holding mechanism 26. The holding mechanism 26 is disposed so that the effective area 27 of the mirror 12 is not blocked.

As a result, as is shown in FIG. 3(b), neither the mirror 12 itself nor the holding mechanism 26 protrudes into the area 28 (area indicated by hatching in the figure) through which the light beam reflected by the mask passes; accordingly, these parts can be disposed so that the light beam is not blocked. The mirror 12 can have various shapes such as rectangular and round as long as the effective area 27 can be covered. Furthermore, in FIG. 3(a), the effective area 27 is round; however, this effective area may have various shapes according to the shape of the illuminating beam and the like.

Figure 6:
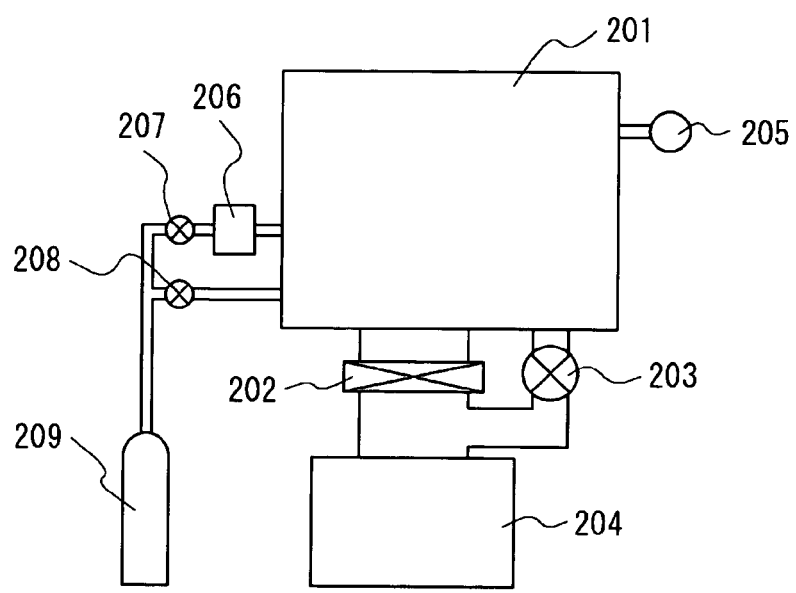
FIG. 6 is a diagram showing the vacuum exhaust system of the vacuum chamber of the EUV exposure apparatus main body.

The EUV exposure apparatus is accommodated inside a vacuum chamber. The construction of the exhaust system is shown in FIG. 6.

All of the constituent elements shown in FIG. 1 are disposed inside the vacuum chamber 201. Of course, it is not absolutely necessary to dispose all of these elements inside a single vacuum chamber; for example, the light source part may be disposed in a separate vacuum chamber, or the light source part and illumination optical system may be disposed in separate vacuum chambers.

A vacuum exhaust pump 204 is connected to the vacuum chamber 201 via a main valve 202. A bypass valve 203 is installed in parallel with the main valve 202. The bypass valve 203 is a valve that can adjust the exhaust rate by means of a variable flow rate; here, a variable orifice valve whose degree of opening can be arbitrarily set by remote control is used. A vacuum gauge 205 is installed in the vacuum chamber 201. Monitoring of the degree of vacuum by means of the vacuum gauge 205, opening and closing of the main valve 202 and bypass valve 203, setting of the flow rate of the bypass valve 203, and monitoring of the operating state of the vacuum exhaust pump 204, are performed by an exhaust control device not shown in the figure.

When the interior of the vacuum chamber 201 is switched from atmospheric pressure to a vacuum state, the relationship between the degree of vacuum and the exhaust rate can be arbitrarily set by the exhaust control device.

In the case of a rapid exhaust, there is a danger that problems such as the following will arise:

(1) Particle may be kicked upward and adhere to the optical elements and the like (in particular, particle adhering to the mask has a fatal effect).

(2) Local pressure differences may be generated inside the optical housing mechanism; as a result, deformation, positional deviation, or the like of the mirrors may occur, so that the characteristics of the optical system deteriorate.

(3) Local thermal contraction may occur inside the optical housing mechanism as a result of a temperature drop caused by adiabatic expansions; as a result, deformation, positional deviation, or the like of the mirrors may occur, so that the characteristics of the optical system deteriorate.

In the present working configuration, such problems can be prevented by optimizing the relationship between the degree of vacuum and the exhaust rate. Once this optimization has been determined, there is no need to repeat such work; exhaust can be performed at an optimized exhaust rate. The exhaust rate is determined by the capacity of the vacuum pump and the degree of vacuum in this case. Accordingly, in cases where no means for controlling the exhaust rate is provided, the degree of vacuum varies, so that the exhaust rate is initially rapid, and then slows as the degree of vacuum becomes higher. In other words, in order to eliminate the above-mentioned problems, it is necessary to set the capacity of the pump so that the initial exhaust rate is controlled to a specified rate or less. However, since the exhaust rate becomes slower as the degree of vacuum becomes higher, the time required to reach the degree of vacuum required by the apparatus in this case is lengthened.

In the present working configuration, on the other hand, since the exhaust rate that varies according to the degree of vacuum continues to be maintained at a high rate in a range in which the problems described above do not occur, the exhaust time can be reduced to a relatively short time. In other words, since particle tends to be kicked up relatively easily immediately after exhaust is initiated from atmospheric pressure, exhaust is performed very slowly; then, after the pressure has dropped somewhat, exhaust can be performed rapidly (to a degree that particle is not kicked up).

Furthermore, when the interior of the vacuum chamber 201 is returned to atmospheric pressure from a vacuum (i.e., leaked), dry nitrogen with a low dew point is introduced from a cylinder 209 in order to prevent the adsorption of water molecules and the like on the inner walls of the chamber. The cylinder 209 is connected to the vacuum chamber 201 via a valve 208 and a bypass valve 207 that is installed parallel to this valve 208. A flow rate control device 206 (mass flow controller) is installed in the system of this bypass valve 207.

The opening and closing of the valve 208 and bypass valve 207, and the setting of the flow rate of the flow rate control device 206, are performed by an exhaust control device (not shown in the figure).

In the case of an abrupt return to atmospheric pressure from a vacuum, there is a possibility arising the problems of (1) and (2) described above will still occur. The leak rate is determined by controlling the flow rate of the dry nitrogen that is introduced into the chamber 201 from the cylinder 209. In order to prevent particle from being kicked up, leaking is performed slowly at first and then increasing the flow rate after the pressure has increased to some extent so that the overall leak time can be shortened without causing problems described above.

The invention claimed is:

1. An extreme ultraviolet exposure apparatus comprising:
   a light source that emits extreme ultraviolet light;
   a plurality of illumination reflective mirrors that direct the extreme ultraviolet light emitted from the light source to a mask;
   a plurality of projection reflective mirrors that direct extreme ultraviolet light reflected by the mask onto a sensitive substrate and that project and focus an image of the mask on the sensitive substrate;
   a projection system optical housing which mechanically holds at least one of the projection reflective mirrors and at least one of the illumination reflective mirrors; and
   a chamber in which at least the projection system optical housing is provided, wherein the projection system optical housing is separate from and independently provided within the chamber.

2. The extreme ultraviolet exposure apparatus according to claim 1, wherein said at least one of the illumination reflective mirrors held in the projection system optical housing comprises one of the illumination reflective mirrors that is closest to the mask on an optical path between the light source and the mask.

3. The extreme ultraviolet exposure apparatus according to claim 2, wherein the illumination reflective mirror that is closest to the mask is not held at an end portion thereof that is closer to the mask.

4. The extreme ultraviolet exposure apparatus according to claim 1, wherein the all of the plurality of projection reflective mirrors are held by the projection system optical housing.

5. The extreme ultraviolet exposure apparatus according to claim 1, wherein the chamber is a vacuum chamber.

6. The extreme ultraviolet exposure apparatus according to claim 5, wherein at least one of an exhaust rate and a leak rate of the vacuum chamber is variable.

7. The extreme ultraviolet exposure apparatus according to claim 1, wherein the projection reflective mirrors are held by the projection system optical housing so that positions and attitudes thereof are adjustable.

8. The extreme ultraviolet exposure apparatus according to claim 1, further comprising:
   a first illumination system optical housing, which is provided in the chamber, and which holds a first quantity of the plurality of illumination reflective mirrors; and
   a second illumination system optical housing, which is provided in the chamber, and which holds a second quantity of the plurality of illumination reflective mirrors.

9. The extreme ultraviolet exposure apparatus according to claim 8, wherein the first quantity includes a plurality of the illumination reflective mirrors, and the second quantity includes a plurality of the illumination reflective mirrors.

10. The extreme ultraviolet exposure apparatus according to claim 9, wherein all of the plurality of projection reflective mirrors are held by the projection system optical housing.

11. The extreme ultraviolet exposure apparatus according to claim 1, further comprising:
    a first illumination system optical housing, which is provided in the chamber, and which holds a first quantity of the plurality of illumination reflective mirrors;
    wherein the projection system optical housing holds a second quantity of the plurality of illumination reflective mirrors.

12. The extreme ultraviolet exposure apparatus according to claim 11, wherein the first quantity includes a plurality of the illumination reflective mirrors, and the second quantity includes a plurality of the illumination reflective mirrors.

13. The extreme ultraviolet exposure apparatus according to claim 12, wherein all of the plurality of projection reflective mirrors are held by the projection system optical housing.

14. An extreme ultraviolet exposure apparatus comprising:
    a light source that emits extreme ultraviolet light;
    a plurality of illumination reflective mirrors that direct the extreme ultraviolet light emitted from the light source to a mask;
    a plurality of projective reflective mirrors that direct extreme ultraviolet light reflected by the mask onto a sensitive substrate and that project and focus an image of the mask on the sensitive substrate; and
    a projection system optical housing which holds at least one of the projection reflective mirrors and at least one of the illumination reflective mirror; and
    a chamber in which at least the projection system optical housing is provided, wherein the projection system optical housing is provided, wherein the projection system optical housing is separate from and independently provided within the chamber;
    wherein the illumination reflective mirror that is closest to the mask comprises a wedge shaped end portion that is oriented so as not to block the extreme ultraviolet light reflected by the mask.

\* \* \* \* \*